United States Patent
DiMeglio (10) Patent No.: US 10,575,423 B2
(45) Date of Patent: Feb. 25, 2020

(54) SMART DEVICE CONCEALMENT PENDANT SYSTEM

(71) Applicant: Dawn DiMeglio, Atlanta, GA (US)

(72) Inventor: Dawn DiMeglio, Atlanta, GA (US)

(73) Assignee: INTERLOKIT INC., Atlanta, GA (US)

(*) Notice: Subject to any disclaimer, the term of this patent is extended or adjusted under 35 U.S.C. 154(b) by 0 days.

(21) Appl. No.: 16/281,900

(22) Filed: Feb. 21, 2019

(65) Prior Publication Data

US 2019/0320544 A1    Oct. 17, 2019

Related U.S. Application Data

(63) Continuation-in-part of application No. 15/950,942, filed on Apr. 11, 2018, now Pat. No. 10,261,547.

(51) Int. Cl.
| | |
|---|---|
| *G06F 1/16* | (2006.01) |
| *H05K 5/03* | (2006.01) |
| *A44C 1/00* | (2006.01) |
| *A41D 25/00* | (2006.01) |
| *H05K 5/00* | (2006.01) |

(52) U.S. Cl.
CPC .............. *H05K 5/03* (2013.01); *A41D 25/003* (2013.01); *A44C 1/00* (2013.01); *H05K 5/0086* (2013.01)

(58) Field of Classification Search
CPC ....................................................... G06F 1/163
USPC ..................... 361/679.03; 312/223.1, 223.2
See application file for complete search history.

(56) References Cited

U.S. PATENT DOCUMENTS

| | | | |
|---|---|---|---|
| 1,512,880 | A | 10/1924 | Cotler |
| 1,549,909 | A | 8/1925 | Cotler |
| 1,606,403 | A | 11/1926 | Dinhofer |
| 1,991,284 | A | 2/1935 | Lewbel |
| 2,065,657 | A | 12/1936 | Coleman |
| 2,557,273 | A | 6/1951 | Gates |
| D293,287 | S | 12/1987 | Cauque et al. |
| 5,206,841 | A | 4/1993 | Boucheron |
| 5,657,298 | A | 8/1997 | Choay |
| D386,426 | S | 11/1997 | Gemmell |
| 6,529,372 | B1 | 3/2003 | Ng et al. |

(Continued)

FOREIGN PATENT DOCUMENTS

| | | |
|---|---|---|
| FR | 2876195 A3 | 4/2006 |
| KR | 200381817 Y1 | 4/2005 |
| SU | 473645 A1 | 2/1976 |

OTHER PUBLICATIONS

Sinn Spezialuhren, "Sinn Spezialuhren—Das Duale Bandsystem // The Dual Strap System," YouTube, Aug. 9, 2016, https://www.youtube.com/watch?v=z64_-_tWmvo.

(Continued)

*Primary Examiner* — Anthony Q Edwards (74) *Attorney, Agent, or Firm* — Troutman Sanders LLP; Chris Davis (57) ABSTRACT

Disclosed herein are smart device concealment systems. The concealment systems can be attached to a user's body or a user's garment and worn as a functional or fashion accessory. The systems can consist of a concealment member, an attachment mechanism configured to attach the concealment system to the user's body or the user's garment, and the concealment member is configured to permit a user to engage the smart device while the smart device is concealed.

20 Claims, 5 Drawing Sheets

(56) References Cited

U.S. PATENT DOCUMENTS

| | | | |
|---|---|---|---|
| D600,138 S | 9/2009 | Tang | |
| 7,946,758 B2 | 5/2011 | Mooring | |
| 9,116,667 B1* | 8/2015 | St. Louis | G06F 1/163 |
| D761,151 S | 7/2016 | Weems et al. | |
| 9,804,571 B2* | 10/2017 | Lee | A44C 25/004 |
| 10,261,547 B1* | 4/2019 | DiMeglio | G06F 1/1656 |
| 2001/0024406 A1 | 9/2001 | Blotky et al. | |
| 2005/0116003 A1 | 6/2005 | Butler et al. | |
| 2007/0279852 A1 | 12/2007 | Daniel et al. | |
| 2009/0133499 A1 | 5/2009 | Cato | |
| 2009/0156272 A1 | 6/2009 | Ohuchi et al. | |
| 2011/0216931 A1* | 9/2011 | Bui | H04R 1/1091 |
| | | | 381/333 |
| 2011/0304971 A1* | 12/2011 | Kelley | H05K 5/0278 |
| | | | 361/679.31 |
| 2014/0337621 A1 | 11/2014 | Nakhimov | |
| 2015/0296963 A1 | 10/2015 | Byun et al. | |
| 2015/0309762 A1* | 10/2015 | Augustine | G06F 1/163 |
| | | | 345/87 |
| 2016/0018846 A1* | 1/2016 | Zenoff | G09G 3/002 |
| | | | 345/174 |
| 2016/0026215 A1* | 1/2016 | Armstrong | G06F 1/163 |
| | | | 320/103 |
| 2016/0028947 A1* | 1/2016 | Wexler | H04N 5/2257 |
| | | | 348/207.11 |
| 2016/0274549 A1* | 9/2016 | Rasmus | A44C 15/005 |
| 2018/0295897 A1* | 10/2018 | Donohoe | A41D 1/002 |

OTHER PUBLICATIONS

International Search Report and Written Opinion issued in related application No. PCT/US2018/065402 dated Apr. 7, 2019.

* cited by examiner

SMART DEVICE CONCEALMENT PENDANT SYSTEM

RELATED APPLICATIONS

This application also claims, under 35 U.S.C. § 120, the benefit of U.S. Non-Provisional patent application Ser. No. 15/950,942, filed Apr. 11, 2018. The entire contents, references and substance of all the above are hereby incorporated by reference as if fully set forth below.

FIELD OF THE DISCLOSURE

This disclosure relates generally to smart device concealment systems. In particular, this disclosure relates to systems configured to conceal smart devices in conspicuous user accessories such as badges and tie clips.

BACKGROUND

Wearable accessories were once mere tools for providing or enhancing the style or functionality of a user's attire. However, with the growth in popularity and necessity of smart devices over the years, wearable accessories are now being used to house these smart devices on a user's person while also enhancing style. Smart devices enable users to answer calls, check text messages and emails, track fitness progress, and monitor health. Accordingly, to merge the style and function aspects of wearable accessories with the utility of smart devices, there are now stylish accessories in assorted colors and high-end finishes to store these devices that are highly coveted and wildly popular amongst consumers. Third-party companies have latched on to this demand, developing and selling even trendier accessories for use with these smart devices. However, all of the accessories currently on the market focus on enhancing the look of these smart devices or readily and openly displaying these smart devices. Other, more practical systems for interacting with these devices should be explored.

SUMMARY

Some wearers of smart devices do not desire to have them publicly displayed. To the contrary, some wearers want to take advantage of smart devices' many features while preserving discretion of use. For example, hidden smart device wearables could increase privacy for user authentication and other confidentiality-preferred transactions. Similarly, users who may be required to wear tracking devices, such as in an employment setting, could increase safety by keeping the tracking devices masked. Indeed, some wearers desire a concealment mechanism configured to assist in making smart devices wearable but hidden. It is an object of the present invention to provide such a system.

Accordingly, disclosed herein are smart device concealment systems, comprising a concealment member including a front face and a back face, the back face of the concealment member configured to engage a smart device, and an attachment mechanism configured to attach the concealment system to a user's body or a user's garment, wherein the front face of the concealment member includes surface ornamentation, and wherein the concealment member is configured to permit a user to engage the smart device while the smart device is concealed.

In some embodiments, the attachment mechanism includes a clip, pin, hook, cord, strap, chain, lanyard, button, hook-and-loop fastener, magnet, snap, threading, zipper, or embedding. In some embodiments, the attachment mechanism includes at least one magnet configured to engage the back face of the concealment member while the user's garment is positioned therebetween.

In some embodiments, the concealment member is a tie clip having a front face and a back face, the smart device embedded in the back face of the tie clip. In other embodiments, the concealment member is a tie clip having a front face and a back face, and the smart device is removably attached to the back face of the tie clip.

In some embodiments, the concealment member is a badge having a front face and a back face, and the smart device embedded in the back face of the badge. In other embodiments, the concealment member is a badge having a front face and a back face, and the smart device is removably attached to the back face of the badge.

In some embodiments, the concealment member is configured to permit a user to engage the smart device by touch or by remote connection while the smart device is concealed. In some embodiments, smart device includes an employee tracking function. In other embodiments, the smart device includes a user authentication function. In still other embodiments, the smart device includes a health monitoring function. In some embodiments, the height and the width of the system is from 5 mm to 100 mm.

Also disclosed herein are smart device concealment systems, comprising a concealment member including a front face and back face, a smart device, and an attachment mechanism configured to attach the concealment system to a user's body or a user's garment, wherein the smart device engages the front face or the back face of the concealment member, wherein the front face of the concealment member includes surface ornamentation, and wherein the concealment member is configured to permit a user to engage the smart device while the smart device is concealed.

In some embodiments, the smart device comprises a user interface side and an opposite back side. In some embodiments, the user interface side of the smart device faces the user's body or the user's garment. In some embodiments, the opposite back side of the smart device engages the back face of the concealment member.

In some embodiments, the concealment member comprises plastic, copper, stainless steel, platinum, silver, gold, or combinations thereof.

In some embodiments, the concealment member is configured to permit charging of the smart device. In some embodiments, the concealment member comprises a charger module for recharging a battery of the smart device.

Also disclosed herein are smart device concealment systems, comprising a concealment member including a front face and a back face, the back face of the concealment member configured to engage a smart device, and an attachment mechanism configured to attach the concealment system to a user's body or a user's garment, wherein the concealment member is configured to permit a user to engage the smart device while the smart device is concealed.

DESCRIPTION OF EXEMPLARY EMBODIMENTS

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Therefore, specific structural and functional details disclosed herein are not to be interpreted as limiting, but merely as a representative basis for teaching one skilled in the art to variously employ the present invention.

Specifically disclosed herein are wearable smart device concealment systems. In some embodiments, disclosed are concealment systems and methods to permit consumers to inconspicuously wear and interact with smart devices. The ability to conceal smart devices would enable consumers to engage in user authentication, track employment activity, monitor potential emergencies, manage childcare, prevent attraction from targeting thieves, and conceal cameras and recording devices useful for recording daily personal and professional activities. Accordingly, this application discloses novel systems that enable wearing smart devices discreetly.

Figure 1:
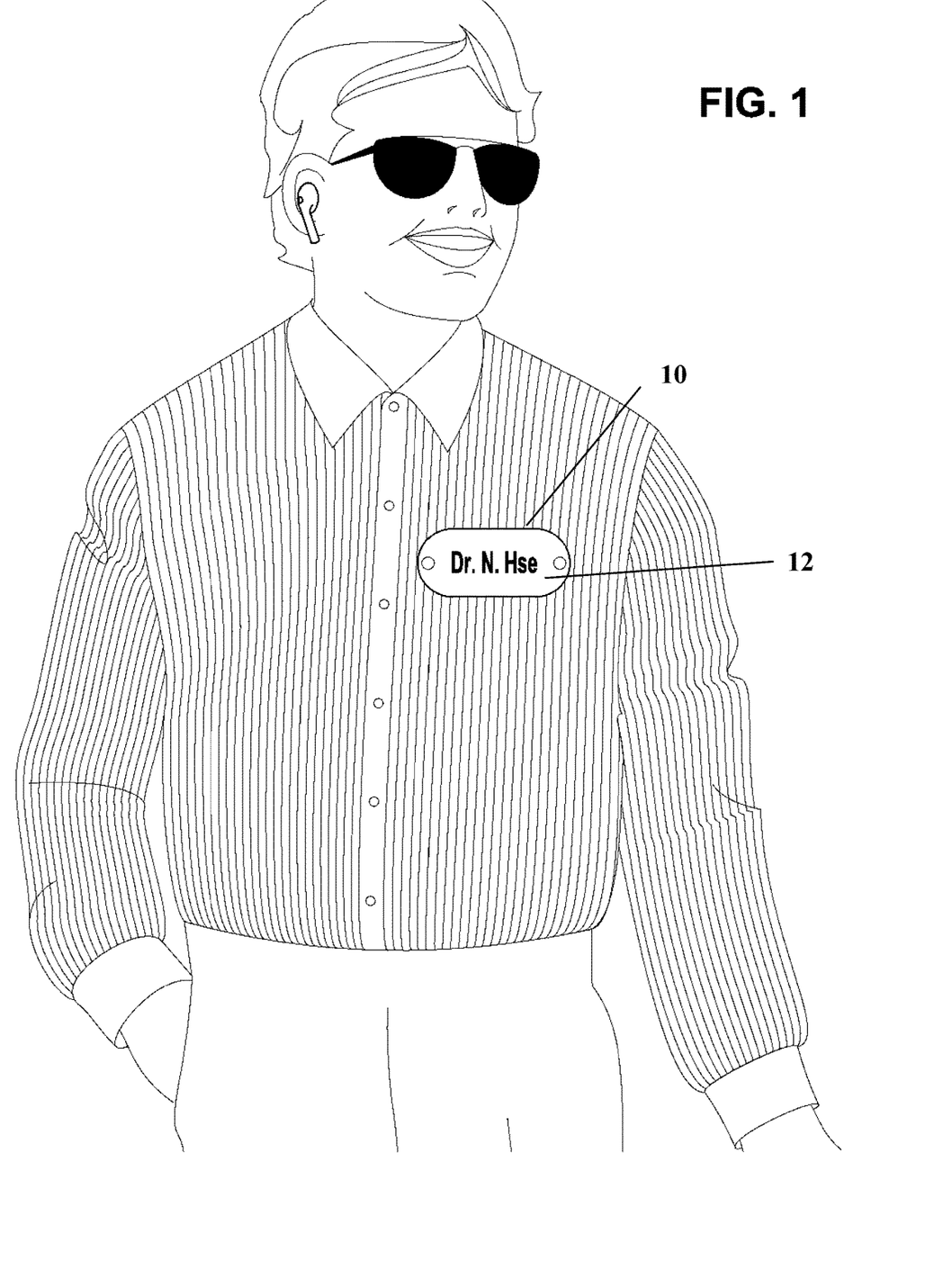
FIG. 1 depicts an embodiment of a concealment device system disclosed herein, not necessarily drawn to scale.
Figure 2:
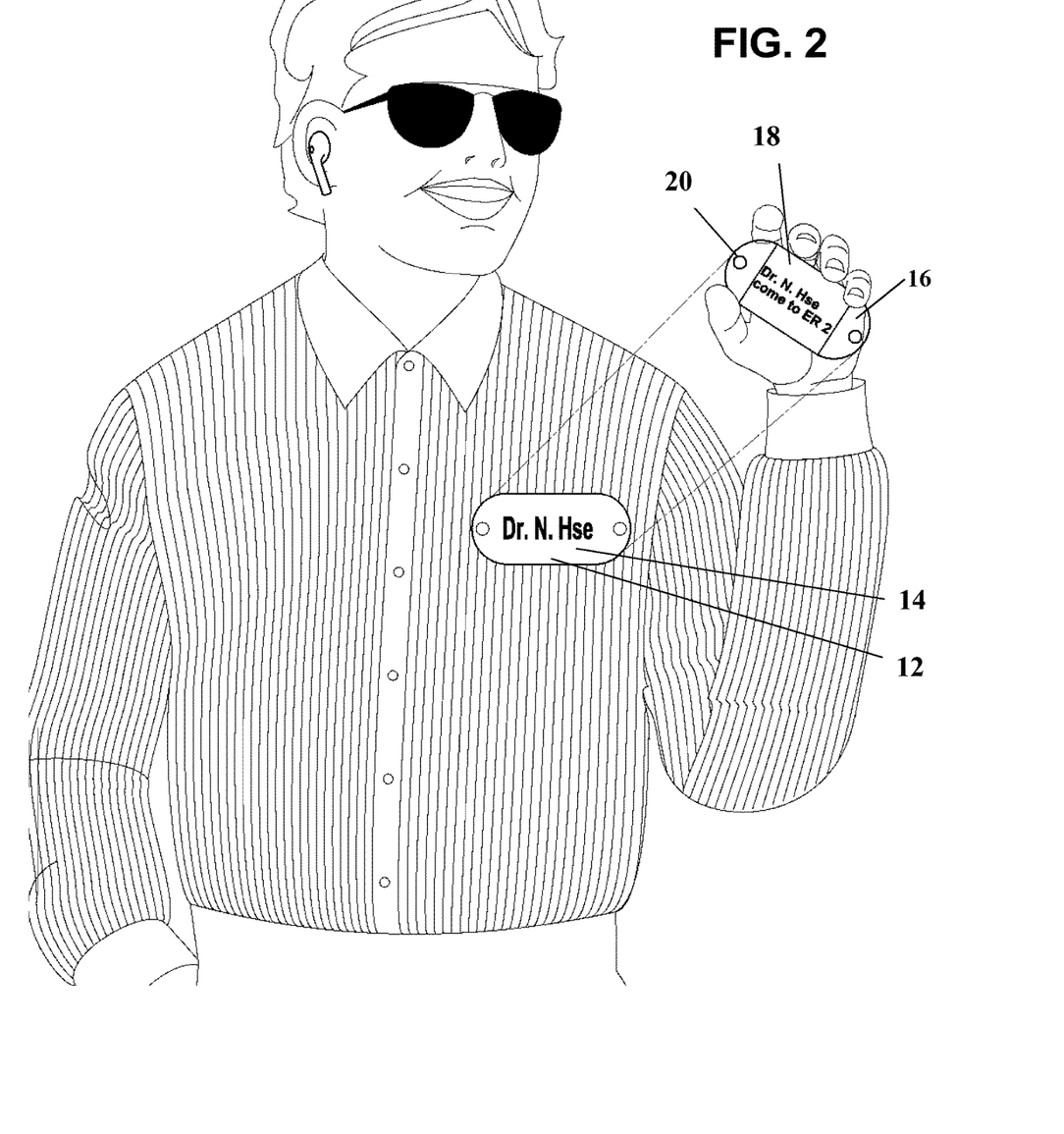
FIG. 2 depicts an embodiment of a concealment device system disclosed herein, not necessarily drawn to scale.

FIGS. 1-7 depict embodiments of wearable smart device concealment systems. FIGS. 1-2 depict smart device concealment system 10, comprising a concealment member 12. In some embodiments, concealment member 12 can have a front face 14, back face 16, and can be configured to receive and retain a smart device 18. In some embodiments, front face 14 can be configured to receive and retain a smart device 18. In other embodiments, back face 16 can be configured to receive and retain a smart device 18. In some embodiments, concealment member 12 can be configured to conceal at least a portion of smart device 18. Concealment system 10 can include any suitable attachment mechanism 20 now known or later developed for securing concealment member 12 onto a user's body or a user's garment. In some embodiments, the attachment mechanism 20 can be configured to engage the back side of the concealment member 12 while the user's garment is positioned therebetween. Similarly, concealment system 10 can include any suitable attachment means now known or later developed for securing smart device 18 into concealment member 12. In some embodiments, the smart device can be removably attached to the back face of the concealment member 12. In some embodiments, the smart device can be embedded into the back face of the concealment member 12.

In some embodiments, concealment member 12 conceals user interaction with smart device 18. In some embodiments, concealment member 12 conceals users view, read, and/or send text messages. In some embodiments, concealment member 12 conceals user view, read, and/or send emails. In some embodiments, concealment member 12 conceals user view missed phone calls. In some embodiments, concealment member 12 conceals user view, engage, or interact with one or more smart device applications. In some embodiments, concealment member 12 conceals user view, engage, or interact one or more smart device clocks. In some embodiments, concealment member 12 conceals user view, engage, or interact with one or more smart device calendars. In some embodiments, concealment member 12 conceals user view, engage, or interact with one or more smart device digital personal assistants, electronic organizers, electronic notepads, any combination thereof, or the like. In some embodiments, concealment member 12 conceals user view, engage, or interact with one or more smart device calculators. In some embodiments, concealment member 12 conceals user view, engage, or interact with one or more smart device health monitors. In some embodiments, concealment member 12 conceals user view, engage, or interact with one or more smart device mechanical and/or electrical components. In some embodiments, concealment member 12 conceals user view, engage, or interact with one or more smart device employee tracking functions. In some embodiments, concealment member 12 conceals user view, engage, or interact with one or more smart device user authentication functions.

Figure 3:
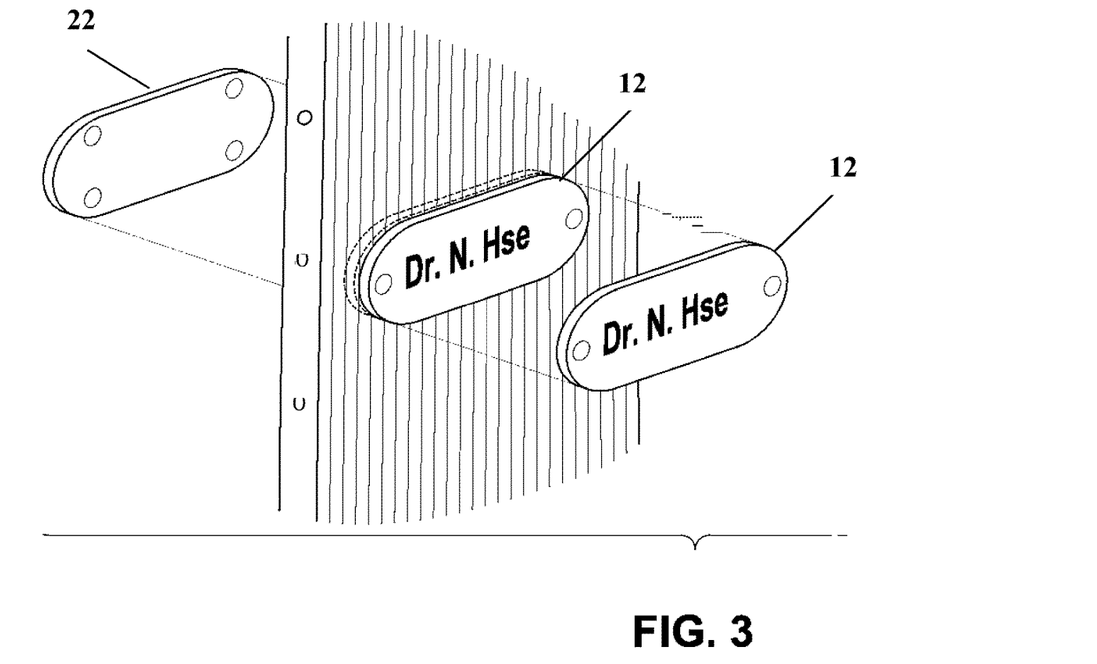
FIG. 3 depicts an embodiment of a concealment device system disclosed herein, not necessarily drawn to scale.
Figure 4:
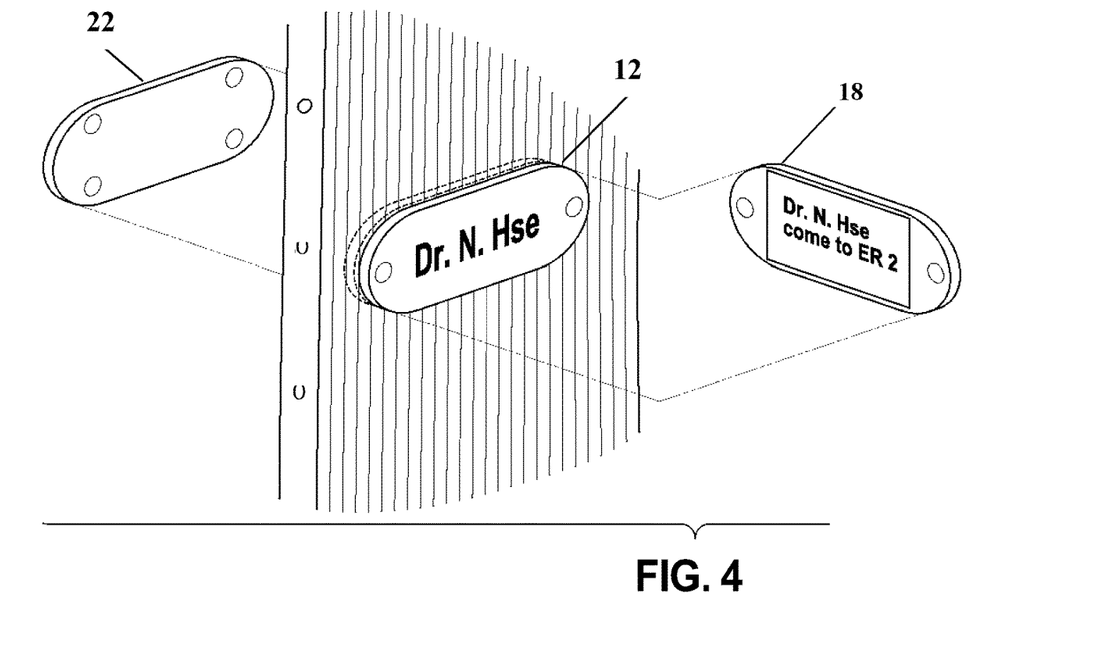
FIG. 4 depicts an embodiment of a concealment device system disclosed herein, not necessarily drawn to scale.

As shown in FIGS. 3-4, concealment system 10 can further comprise back casing 22 joined to concealment member 12. In some embodiments, back casing 22 can assist with securing the concealment member 12 to the user's body or user's garment. In some embodiments, the smart device 18 can include a user interface side and an opposite back side. In some embodiments, the user interface side of smart device 18 is fully covered. In other embodiments, the user interface side of smart device 18 is partially covered. The user interface side can be engaged remotely and/or by touch.

In some embodiments, smart device 18 can be at least partially attached to any suitable attachment mechanism, facing forwards or backwards. In some embodiments, smart device 18 can be at least partially housed within back casing 22 facing forwards or backwards. In some embodiments, smart device 18 can be at least partially attached to back casing 22, by any suitable attachment mechanism, facing forwards or backwards. In some embodiments, smart device 18 can be at least partially housed within concealment member 12 facing forwards or backwards. In some embodiments, smart device 18 can be at least partially attached to concealment member 12, by any suitable attachment mechanism, facing forwards or backwards. In some embodiments, back casing 22 is removable to facilitate a "lift and look" feature where users can inconspicuously view, engage, or interact with smart device or smart device data.

In some embodiments, the concealment member 12 can include uniform or non-uniform wearable accessories such as employee identification, badges, name-tags, pins, patches, helmets, hats, visors, vests, tie-clips, comparable wearable uniform or non-uniform accessories, or combinations thereof. In some embodiments, the attachment mechanism 20 can include a clip, pin, hook, cord, strap, chain, lanyard, button, hook-and-loop fastener, magnet, snap, threading, zipper, embedding, combinations thereof, and the like. In some embodiments, the attachment mechanism 20 can include at least one magnet configured to engage the back face of the concealment member while the user's garment is positioned therebetween.

In some embodiments, concealment member 12 can include one or more chain attachments. In some embodiments, the one or more chain attachments can include necklace attachments, bracelet attachments, fob attachments, cords, straps, any combination thereof, and the like. In some embodiments, concealment member 12 can include side cutouts to enable access to smart device mechanical and/or electrical components. In some embodiments, the mechanical and/or electrical components include buttons, charge ports, touch-screen interface, electrical component access openings, and the like.

Figure 5:
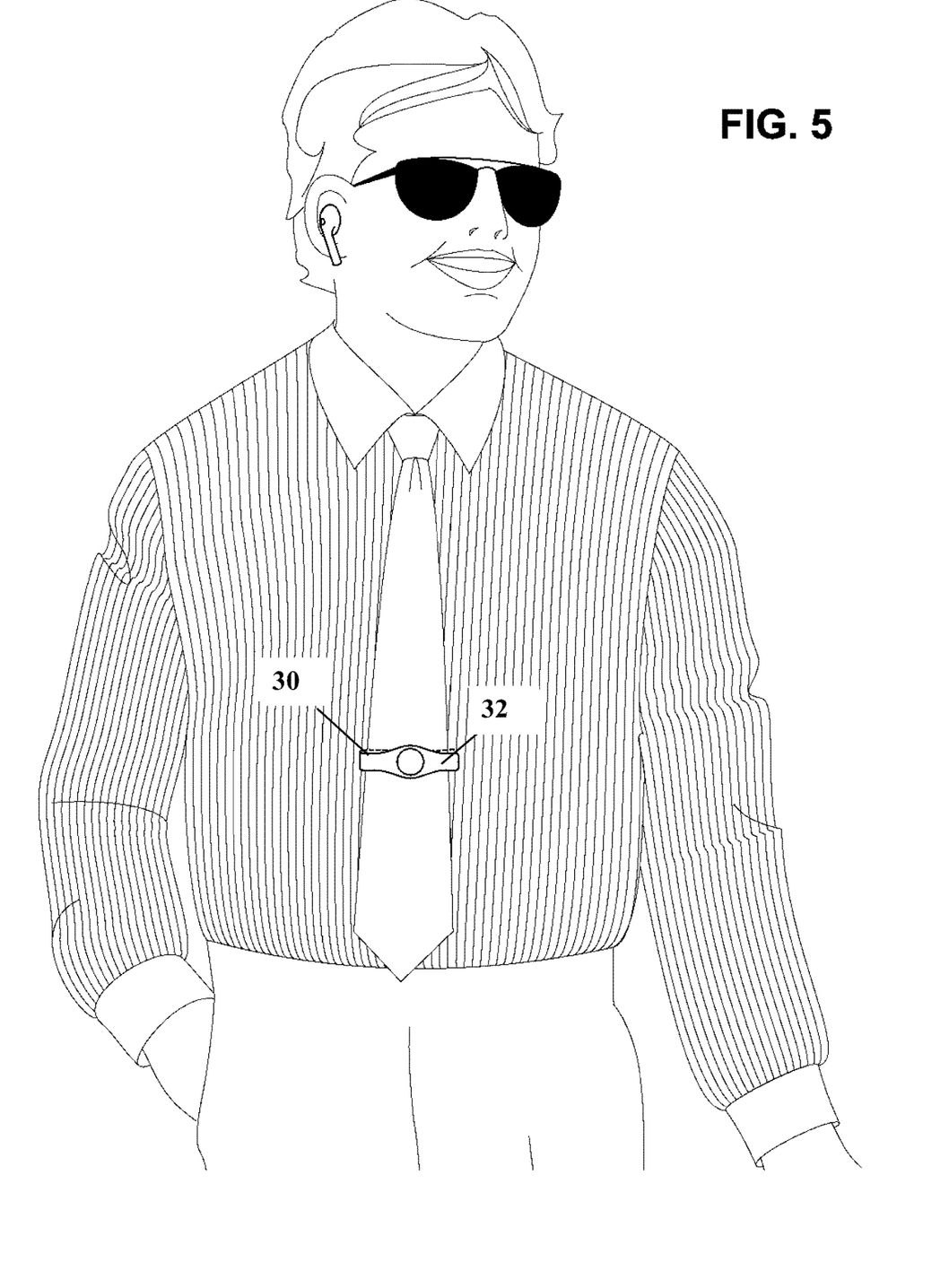
FIG. 5 depicts an embodiment of a concealment device system disclosed herein, not necessarily drawn to scale.
Figure 6:
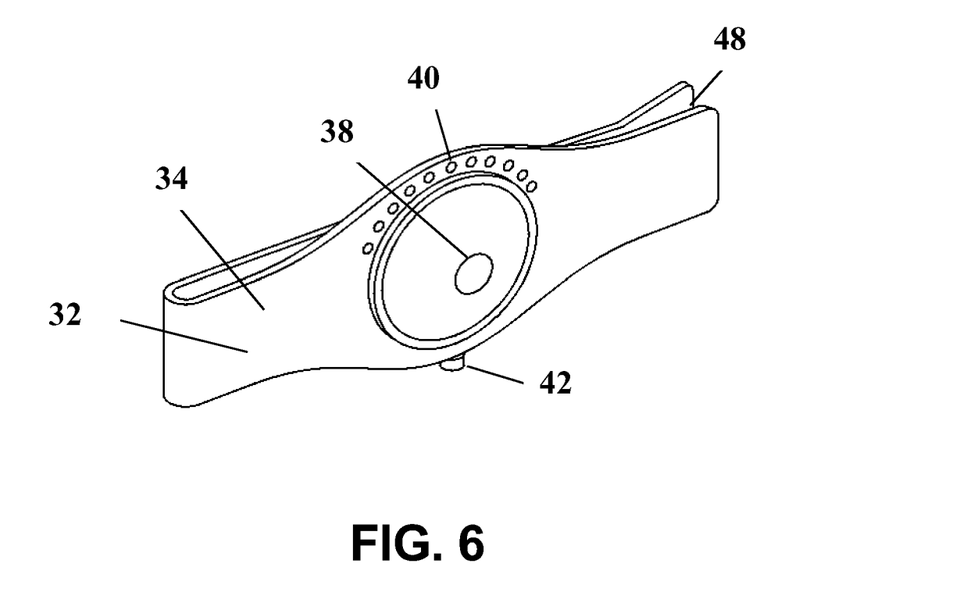
FIG. 6 depicts front view of an embodiment of a concealment device system.
Figure 7:
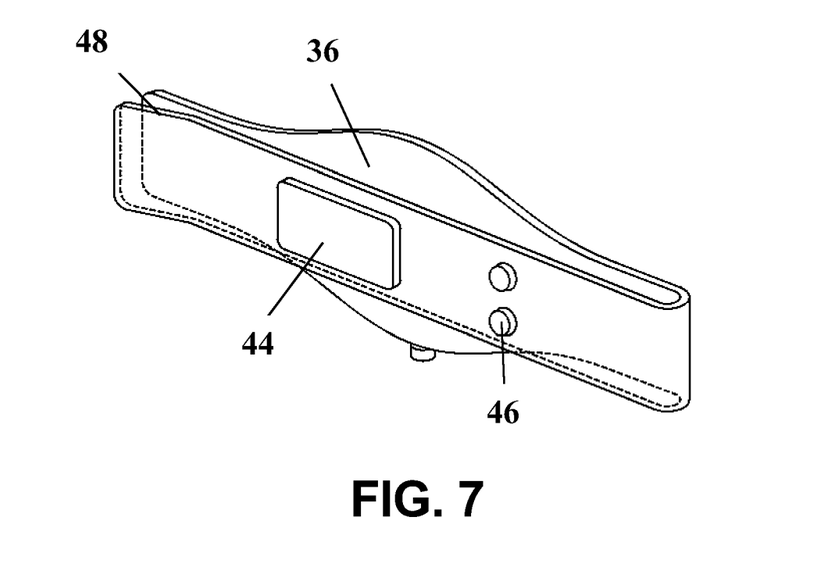
FIG. 7 depicts a back view of an embodiment of a concealment device system.

FIG. 5 depicts smart device concealment system 30, comprising a concealment member 32. As shown in FIGS. 6-7, concealment member 32 can include a front face 34, back face 36, and can be configured to receive and retain one or more smart device components. In some embodiments, front face 34 can be configured to receive and retain one or more smart device components. In other embodiments, back face 36 can be configured to receive and retain one or more smart device components. In some embodiments, concealment member 32 can be configured to conceal at least a portion of smart device components. FIG. 6 shows an exemplary embodiment, where concealment member 32 includes a tie clip and the tie clip a number of smart device components such as a camera lens 38, speaker ports 40, and a home and/or activation button 42, are embedded in the concealment member and concealed by the front face 34 of concealment member 32. FIG. 7 shows an exemplary embodiment, where heart monitor 44, and charge contacts 46 are concealed by concealment member 32. Concealment member 32 can include any suitable attachment mechanism 48 now known or later developed for securing concealment member 32 onto a user's body or a user's garment. Similarly, concealment system 10 can include any suitable attachment means now known or later developed for securing smart device 18 into concealment member 12.

In some embodiments, concealment systems 10 and 30 can further comprise one or more functional inserts for housing personal items. The one or more functional inserts can be a pill receptacle, a currency receptacle, a key receptacle, a fold-out photo album, photo frame, earphones receptacle, watch receptacle, any combination thereof, or the like. In some embodiments, one or more functional inserts is removably attached to the accessory attachment. In some embodiments, one or more functional inserts is removably housed inside concealment member 12, back casing 22, or combinations thereof. In some embodiments, the functional insert can comprise a housing for earphones. In some embodiments, the earphones are AIRPODS®.

In some embodiments, front faces 14 and 34 can be decorative. In some embodiments, front faces 14 and 34 can include surface ornamentation. In some embodiments, the surface ornamentation can include labeling, set stones, enameling, textured and etched designs, fused metal embellishments, and the like. In some embodiments, concealment member 12 can be removably attachable such that one decorative concealment member can be interchanged for a different decorative concealment member. In some embodiments, concealment member 12 can comprise most generally all metals and alloys thereof now known or later developed or discovered, including, but not limited to copper, stainless steel, platinum, silver, gold, gold plated, pewter, aluminum, tungsten, titanium, and/or any combination thereof. In some embodiments, the concealment member can comprise polymers including, but not limited to plastic and rubber, ceramic, wood, glass, any material now known or later discovered or developed used to make jewelry and related accessories, and/or any combination thereof. Still similarly, back casing 22 can be made from any suitable material now known or later discovered, including but not limited to polymer material, aluminum, wood, ceramic, stainless steel, and/or any combinations thereof.

In some embodiments, concealment systems 10 and 30 can be any height and/or any width suitable to accommodate smart device 18 or related smart devices components. In some embodiments, concealment system 10 can be any height and/or any width suitable to at least partially house smart device 42. In some embodiments, concealment system can have a height of from 5 mm to 100 mm. In some embodiments, concealment system can have a height of from 10 mm to 80 mm. In some embodiments, concealment system can have a height of from 15 mm to 70 mm. In some embodiments, concealment system can have a height of from 20 mm to 60 mm. In some embodiments, concealment system can have a height of from 30 mm to 55 mm. In some embodiments, concealment system can have a height of from 35 mm to 50 mm. In some embodiments, concealment system can have a height of from 35 mm to 45 mm. In some embodiments, concealment system can have a height of from 35 mm to 40 mm. In some embodiments, concealment system can have a height of from 40 mm to 50 mm. In some embodiments, concealment system can have a height of from 45 mm to 50 mm. In some embodiments, concealment system can have a width, of from 5 mm to 100 mm. In some embodiments, concealment system can have a width of from 10 mm to 80 mm. In some embodiments, concealment system can have a width of from 15 mm to 70 mm. In some embodiments, concealment system can have a width of from 20 mm to 60 mm. In some embodiments, concealment system can have a width of from 30 mm to 55 mm. In some embodiments, concealment system can have a width of from 35 mm to 50 mm. In some embodiments, concealment system can have a width of from 35 mm to 45 mm. In some embodiments, concealment system can have a width of from 35 mm to 40 mm. In some embodiments, concealment system 10 can have a width of from 40 mm to 50 mm. In some embodiments, concealment system 10 can have a width of from 45 mm to 50 mm.

Concealment system can be any suitable shape to engage smart device. Similarly, concealment member can be any suitable shape to engage smart device or smart device components. In some embodiments, concealment member is generally rectangular. In some embodiments, concealment member is generally recessed. In some embodiments, concealment member is sufficiently recessed to receive and hold smart device or smart device components. In some embodiments, concealment member is generally flat. In some embodiments, concealment member is sufficiently flattened to receive and hold smart device or smart device components. Back casing can be any suitable shape to engage smart device. In some embodiments back casing is generally rectangular. In some embodiments, back casing is generally recessed, and contoured so as to engage at least the concealment member, as shown.

In some embodiments, the concealment member can provide smart device protection against damage from scratches, cracks, glass fractures, and the like. Specifically, the concealment member can further comprise bumpers, pads, a combination thereof, and the like configured to protect the smart device or smart device components from the above-mentioned types of damage.

In some embodiments, the smart device can be a smart watch, such as an APPLE WATCH®, a tracking device, such as an employee tracking device, a heart monitoring device, camera, computer, and recording device, the like, or combinations thereof. In some embodiments, smart device can include at least one intermediary connection component to join smart device with an accessory. In some embodiments, the at least one intermediary connection component can comprise at least one accessory receiving component configured to join smart device with an accessory or the concealment member. In some embodiments, smart device can comprise any suitable accessory receiving component now known or later developed. The accessory or concealment member can either be pre-attached to the smart device as part of smart device manufacturer's design or a compatible accessory can be purchased and attached to the smart device for use with or as the disclosed concealment system.

As shown in FIG. 7, in some embodiments, smart device concealment system 30 can further comprise a charging module 46 such as charge contacts for recharging a battery of the smart device. In some embodiments, charging module 46 comprises a rechargeable battery powered by Lithium Polymer, Lithium Ion, or the like. In some embodiments, charging module 46 can operate as a motion charger where battery charging is activated by an actuating motion of charging module 46, concealment systems 10 or 30, or combinations thereof. In some embodiments, charging module 46 comprises a switch (not shown) that upon actuation moves from a first position to a second position, and consequently activates charging module 46. In some embodiments, a charging module can be disposed on back casing 22 or concealment member 12 by any suitable attachment means now known or later discovered.

Some employment activities that can be tracked with the concealment system can include tracking attendance, overtime, performance, labor compliance, paging, employee-to-employee communication, drug and alcohol detection, employee panic function, accepting and/or processing payments, public announcements, monitoring customer transactions, combinations thereof, and the like. Some daily personal and professional activities include, monitoring children activities, monitoring temperatures in homes, cars, and the like, daycare monitoring, location tracking, requesting and/or delivering technical support, control office building, house, and automobile functions (e.g. lighting, temperature, doors, and the like), remote control access, internet and cell phone use monitoring, flash light or other emergency lighting, space and proximity utilization measuring through user movement. Users who can benefit from use of the concealment systems can include police, military, healthcare, child care, manufacturing, construction, retail, banking employees, legal applications, janitorial services, food service, combinations thereof, and the like.

What is claimed is:

1. A wearable smart device concealment system, comprising:
    a concealment member including a front face and a back face, the back face of the concealment member configured to engage a smart device; and
    an attachment mechanism configured to attach the concealment system to a user's body or a user's garment;
    wherein the front face of the concealment member includes surface ornamentation,
    wherein the concealment member is configured to permit a user to engage the smart device while the smart device is concealed,
    wherein the concealment member at least partially conceals the smart device, and
    wherein the smart device is an electronic device capable of connecting to another electronic device or a network and is configured to transfer data to that other device or network.

2. The smart device concealment system of claim 1, wherein the attachment mechanism includes a clip, pin, hook, cord, strap, chain, lanyard, button, hook-and-loop fastener, magnet, snap, threading, zipper, or embedding.

3. The smart device concealment system of claim 1, wherein the attachment mechanism includes at least one magnet configured to engage the back face of the concealment member while the user's garment is positioned therebetween.

4. The smart device concealment system of claim 1, wherein the concealment member is a tie clip having a front face and a back face, and the smart device is embedded in the back face of the tie clip.

5. The smart device concealment system of claim 1, wherein the concealment member is a tie clip having a front face and a back face, and the smart device is removably attached to the back face of the tie clip.

6. The smart device concealment system of claim 1, wherein the concealment member is a badge having a front face and a back face, and the smart device is embedded in the back face of the badge.

7. The smart device concealment system of claim 1, wherein the concealment member is a badge having a front face and a back face, and the smart device is removably attached to the back face of the badge.

8. The smart device concealment system of claim 1, wherein the concealment member is configured to permit a user to engage the smart device by touch or by remote connection while the smart device is at least partially concealed.

9. The smart device concealment system of claim 1, wherein the smart device includes an employee tracking function.

10. The smart device concealment system of claim 1, wherein the smart device includes a user authentication function.

11. The smart device concealment system of claim 1, wherein the smart device includes a health monitoring function.

12. The smart device concealment system of claim 1, wherein the height of the system is from 5 mm to 100 mm.

13. The smart device concealment system of claim 1, wherein the width of the system is from 5 mm to 100 mm.

14. A wearable smart device concealment system, comprising:
    a concealment member including a front face and back face;
    a smart device; and
    an attachment mechanism configured to attach the concealment system to a user's body or a user's garment;
    wherein the smart device engages the front face or the back face of the concealment member;
    wherein the front face of the concealment member includes surface ornamentation,
    wherein the concealment member is configured to permit a user to engage the smart device while the smart device is concealed,
    wherein the concealment member at least partially conceals the smart device, and
    wherein the smart device includes a smart watch, a heart monitoring device, a user authentication device, and/or a device capable of telephone calls, text messaging, and/or engaging the internet.

15. The smart device concealment system of claim 14, wherein a back side of the smart device engages the back face of the concealment member.

16. The smart device concealment system of claim 14, wherein the concealment member comprises plastic, copper, stainless steel, platinum, silver, gold, or combinations thereof.

17. The smart device concealment system of claim 14, wherein the concealment member is configured to permit charging of the smart device.

18. The smart device concealment system of claim 17, further comprising a charger module for recharging a battery of the smart device.

19. The smart device concealment system of claim 14, further comprising cutouts to enable access to smart device electrical and/or mechanical components.

20. A wearable smart device concealment system, comprising:
- a concealment member including a front face and a back face, the back face of the concealment member configured to engage a smart device; and
- an attachment mechanism configured to attach the concealment system to a user's body or a user's garment, and
- wherein the concealment member is configured to permit a user to engage the smart device while the smart device is concealed, and
- wherein the concealment member at least partially conceals the smart device.

* * * * *